(12) United States Patent
Hirakawa

(10) Patent No.: US 6,504,789 B2
(45) Date of Patent: Jan. 7, 2003

(54) SEMICONDUCTOR MEMORY DEVICE

(75) Inventor: Tsuyoshi Hirakawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/740,478

(22) Filed: Dec. 18, 2000

(65) Prior Publication Data
US 2001/0007541 A1 Jul. 12, 2001

(30) Foreign Application Priority Data

Dec. 27, 1999 (JP) ............................................ 11-371729

(51) Int. Cl.[7] .................................................. G11C 7/02
(52) U.S. Cl. ...................................... 365/233; 365/210
(58) Field of Search .......................... 365/233, 230.03, 365/230.06, 185.2, 185.21, 210

(56) References Cited

U.S. PATENT DOCUMENTS

| 5,729,500 | A | * | 3/1998 | Shinozaki | .................. | 365/233 |
| 5,933,379 | A | * | 8/1999 | Park et al. | .................. | 365/233 |
| 5,966,343 | A | * | 10/1999 | Thurston | .................... | 365/233 |
| 5,986,918 | A | * | 11/1999 | Lee | ............................. | 365/233 |
| 6,041,015 | A | * | 3/2000 | Miyamoto et al. | .......... | 365/233 |
| 6,052,329 | A | * | 4/2000 | Nishino et al. | ............. | 365/233 |
| 6,151,270 | A | * | 11/2000 | Jeong | ......................... | 365/233 |
| 6,215,725 | B1 | * | 4/2001 | Komatsu | ..................... | 365/233 |
| 6,262,931 | B1 | * | 7/2001 | Kono et al. | ................. | 365/233 |
| 6,269,048 | B1 | * | 7/2001 | Kano et al. | ................. | 365/233 |

FOREIGN PATENT DOCUMENTS

JP          10-69770          3/1998

* cited by examiner

Primary Examiner—Trong Phan
(74) Attorney, Agent, or Firm—Choate, Hall & Stewart

(57) ABSTRACT

To provide a semiconductor memory device that can ensure adequate read margin by effectively utilizing a period for assigned CAS latency. CAS latency is preset before reading. An ACT command is input to activate a word line corresponding to a row address. A READ command is input at a zeroth clock pulse of an internal clock and a digit line corresponding to a column address is connected to a sense amplifier. A sense amplifier activation signal is activated independently of CAS latency to start an equalizing and sense operation. Afterwards, a sense amplifier activation signal is deactivated after two through 5 cycles depending on CAS latency, and the equalizing and sense operation are terminated. Subsequently, an output operation for transferring the sensed result from the sense amplifier to an output pin is performed, and first data is available from a fifth through the eighth clock pulse depending on CAS latency.

15 Claims, 10 Drawing Sheets

MODE SETTING DATA

| A12 | A11 | A10 | A09 | A08 | A07 | A06 | A05 | A04 | A03 | A02 | A01 | A00 |
|---|---|---|---|---|---|---|---|---|---|---|---|---|
| X | X | X | X | X | X | RAS Latency | | CAS Latency | | Burst Type | Burst Length | |

SEMICONDUCTOR MEMORY DEVICE

BACKGROUND OF THE INVENTION

1. Field of the Invention

The present invention relates to a semiconductor memory device that is capable of assigning the read time of data stored in memory cells. For example, the invention relates to a semiconductor memory device that controls the read time in terms of latency whose units are defined as the number of cycles of an externally applied clock.

2. Description of the Related Art

Among recent semiconductor memory devices, there is one that can externally assign the read time from the time that the read instruction is given until data stored in a memory cell is read out and is output from the semiconductor memory device. In particular, for synchronous mask ROM (synchronous mask read only memory), SDRAM (synchronous dynamic random access memory) and the like, whose operations are synchronized to the clock of the system that the semiconductor memory devices are used in, a term "latency", which denotes the aforementioned read time by the number of clock cycles, is used.

By enabling latency to be externally assigned like this, it is possible to set the most appropriate read time according to the performance of the semiconductor memory device itself, the requirements of the system, and the user's application. That is to say, since the read time required by the semiconductor memory device is determined by the interrelationship between the semiconductor memory device and the system, there is a requirement that the read time be flexibly controlled depending on various conditions. For example, in recent years the operating frequencies of systems have been increasing, however, the reality is that the performance of semiconductor memory devices has not been keeping pace with the operating speed of systems. Consequently, in such a situation, it is necessary to bridge the performance gap that exists between systems and semiconductor memory devices, by assigning a large value of latency.

As an example of a semiconductor memory device used heretofore, synchronous mask ROM reads out data stored in memory cells as follows. Latency from CAS (column address strobe) signal active to valid data output, termed "CAS latency" is set externally from the synchronous mask ROM. Here, CAS latency may be abbreviated to "CL" in figures to be referred to in the descriptions hereunder and this description. In the case where reading is actually performed, first, a row address is assigned, the RAS (row address strobe) signal is activated, and the word line corresponding to the given row is address is activated.

Next, a column address is assigned, and the CAS signal is activated to select the digit line (also referred to as the bit line or data line) corresponding to the given column address. As a result, a unique memory cell that is specified by the row address and the column address is selected. Furthermore, as the CAS signal is active, the sense amplifier activation signal is made active to put the sense amplifier into an operational condition, and the sense amplifier senses the data stored in the memory cell via the selected digit line. The result sensed by the sense amplifier is output from the synchronous mask ROM via an output buffer or the like. Here, with conventional synchronous mask ROM, the sense amplifier activation signal is generated by utilizing a delay circuit and the like incorporated therein, and hence the period that the sense amplifier activation signal is valid is always constant.

Here, FIG. 10 is a timing diagram showing the operation of the aforementioned conventional synchronous mask ROM. In the figure, timing from the time that the CAS signal becomes active to the time that data output is completed is shown for several values of CAS latency. Furthermore, "CLK" shown in the figure is a clock inside the synchronous mask ROM, which is synchronized to the system clock. For example, in the case where the CAS latency is "5", the sense amplifier activation signal is activated [in other words, is set to "L" (low level)] immediately after the CAS signal is issued at the rising edge of the zeroth clock pulse of the clock CLK, and is deactivated [in other words, is set to "H" (high level)] immediately after the rising edge of the second clock pulse.

Then, data output is started around the falling edge of the fourth clock pulse, and at the rising edge of the fifth clock pulse when time corresponding to CAS latency "5" has passed since the CAS signal was given, a first data "D0" which is to be burst output becomes definite and is output outside as output data. Similarly to that mentioned above, also in cases other than CAS latency "5" due to different values of CAS latency, in the case where CAS latency is "6" through "8", the value of data "D0" becomes definite at the rising edges of the sixth clock pulse through the eighth clock pulse. In such a way, with conventional synchronous mask ROM, whatever value is assigned to CAS latency, the valid period of the sense amplifier activation signal is always two cycles of clock CLK, which is constant.

In contrast to the abovementioned synchronous mask ROM, to give one example where the active period of the sense amplifier activation signal is varied depending on CAS latency, is an SDRAM that is disclosed in Japanese Unexamined Patent Application, First Publication No. 10-69770. This SDRAM is designed with a precondition that the operating frequency gets lower as the CAS latency value decreases. In this case, the period of each clock cycle becomes longer as the CAS latency value decreases. Accordingly, in the case where the CAS latency value is decreased, the active period of the column line select signal corresponding to the access period of the memory cells and the active period of a short signal corresponding to the equalizing period of the digit line are both lengthened.

That is to say, the arrangement is such that the ratio of the active period of the column line select signal to the active period of the short signal is always approximately constant, independent of CAS latency, and also the sum of these two periods is always equal to one cycle of the system clock, independent of CAS latency. To describe the abovementioned with specific numerical values, in the case where the CAS latency is "2" through "4", the clock cycle times are "9 ns", "7 ns" and "6 ns" respectively. At this time, the active periods of the column line select signal are "6 ns", "4.6 ns" and "4 ns" respectively, and the active periods of the short signal are "3 ns", "2.4 ns" and "2 ns" respectively.

From the above, with an existing synchronous mask ROM, a delay circuit and the like is used to generate the sense amplifier activation signal. Therefore, whatever value the CAS latency may be, the active period of the sense amplifier activation signal has been constant. Accordingly, with the abovementioned synchronous mask ROM, timing must be designed based on the smallest value of CAS latency ("5" in the range shown in FIG. 10).

However, for values of CAS latency other than this, considering the case of CAS latency being "8" for example, data may be output for the first time at the rising edge of the eighth clock pulse. That is to say, the active period of the sense amplifier activation signal may not necessarily be two cycles, but may be longer than that. The greater the CAS latency value is, the longer the active period of the sense amplifier activation signal might be extended. In that sense, it can be said that with conventional synchronous mask ROM, the timing design was very inefficient.

If the active period of the sense amplifier activation signal is always constant, the operating margin of the sense amplifier when reading out data stored in memory cells is always the same whatever the value of CAS latency. By having an operating margin on the sense amplifier, it is possible to increase the operating frequency of the synchronous mask ROM by a corresponding amount. However, there is a problem in that with a synchronous mask ROM like that mentioned above, whatever the CAS latency may be set to, reading can in be performed only at the same operating frequency.

On the other hand, with the SDRAM mentioned above, also including the case where the CAS latency is other than "1", since the sum of the active period of the column line select signal and the active period of the short signal is equal to one cycle of the clock, data stored in the memory cell is read within the period of the first clock pulse. However, in this case also, if the CAS latency is, for example, "4", data is output for the first time at the timing of the fourth clock pulse. Consequently, in the case where the CAS latency is other than "1", compared with when the CAS latency is "1", both the active period of the column line select signal and the active period of the short signal must be able to be further extended.

In such a way, with the abovementioned SDRAM also, the timing design is similarly inefficient to the existing synchronous mask ROM. That is to say, with the abovementioned SDRAM, as the operating frequency becomes higher, the value of CAS latency is increased, and read time must be able to be lengthened. Nevertheless, as the operating frequency is increased, the active period of the column line select signal and the active period of the short signal are shortened. As a result, in the case where the operating frequency is low, an operating margin can be obtained. However, as the operating frequency becomes higher, there is a corresponding reduction in read margin, and hence there is a tendency towards unreliability.

SUMMARY OF THE INVENTION

Accordingly, an object of the present invention is to provide a semiconductor memory device that can ensure adequate margin for reading by effectively utilizing the period corresponding to CAS latency assigned externally.

A semiconductor memory device of the present invention is provided with a latency length setting circuit for variably setting latency length, being a period from the time that an instruction to read data stored in a memory cell is performed to when the data is read out from the memory cell and output outside, and a control circuit for controlling such that the read operating period from when the instruction to read data is performed to when reading of the data is completed is proportional to the latency length.

In this manner, as the latency length increases, the operating period for reading becomes longer, and hence the operating margin when reading can be ensured to that extent. Consequently, even in the case where the operating frequency is increased, by increasing the latency length the timing can have adequate margin, hence enabling the operating frequency to be further increased.

With the present invention, the read operating period may be synchronized to a clock signal used to determine the latency length. By doing so, even if the operating frequency is changed, the cycle of the clock signal changes along with it. Therefore, the read operating period can be automatically extended and contracted to synchronize it to the cycle of the clock signal.

Furthermore, with the present invention, the read operating period may be set based on data of the latency length applied to the address signal lines for assigning read addresses. By doing so, signal lines for inputting address signals can be utilized to set the latency length, so that special signal lines for setting the latency length do not need to be installed.

Moreover, with the present invention, during the sense amplifier activation period for activating sense amplifiers, depending on the currents flowing in the memory cell and reference cell inside the sense amplifier, the difference between the voltages applied to the differential input terminals of a differential amplifier inside the sense amplifier may increase with time. By doing so, the longer the sense amplifier activation period becomes in proportion to the latency length, the wider the voltage difference between the memory cell, being the object to be read out, and the reference cell becomes, which is advantageous to reading.

Moreover, with the present invention, the read operating period may be set to the period obtained by subtracting the output period, being the period from when reading is completed to when the data stored in the memory cell is output outside, from the latency length. By doing so, while consideration is given that the access time is not rate-limited by the output time, the read operating period can be ensured as long as possible. Consequently, it is possible to maximize the read margin.

BRIEF DESCRIPTION OF THE DRAWINGS

FIG. 2A is an explanatory diagram showing the detailed format of mode setting data to be applied to the address bus for mode setting. FIG. 2B is a timing diagram showing the relationship between the mode register setting command and mode setting data when setting the mode.

DETAILED DESCRIPTION OF THE PREFERRED EMBODIMENTS

Figure 6:
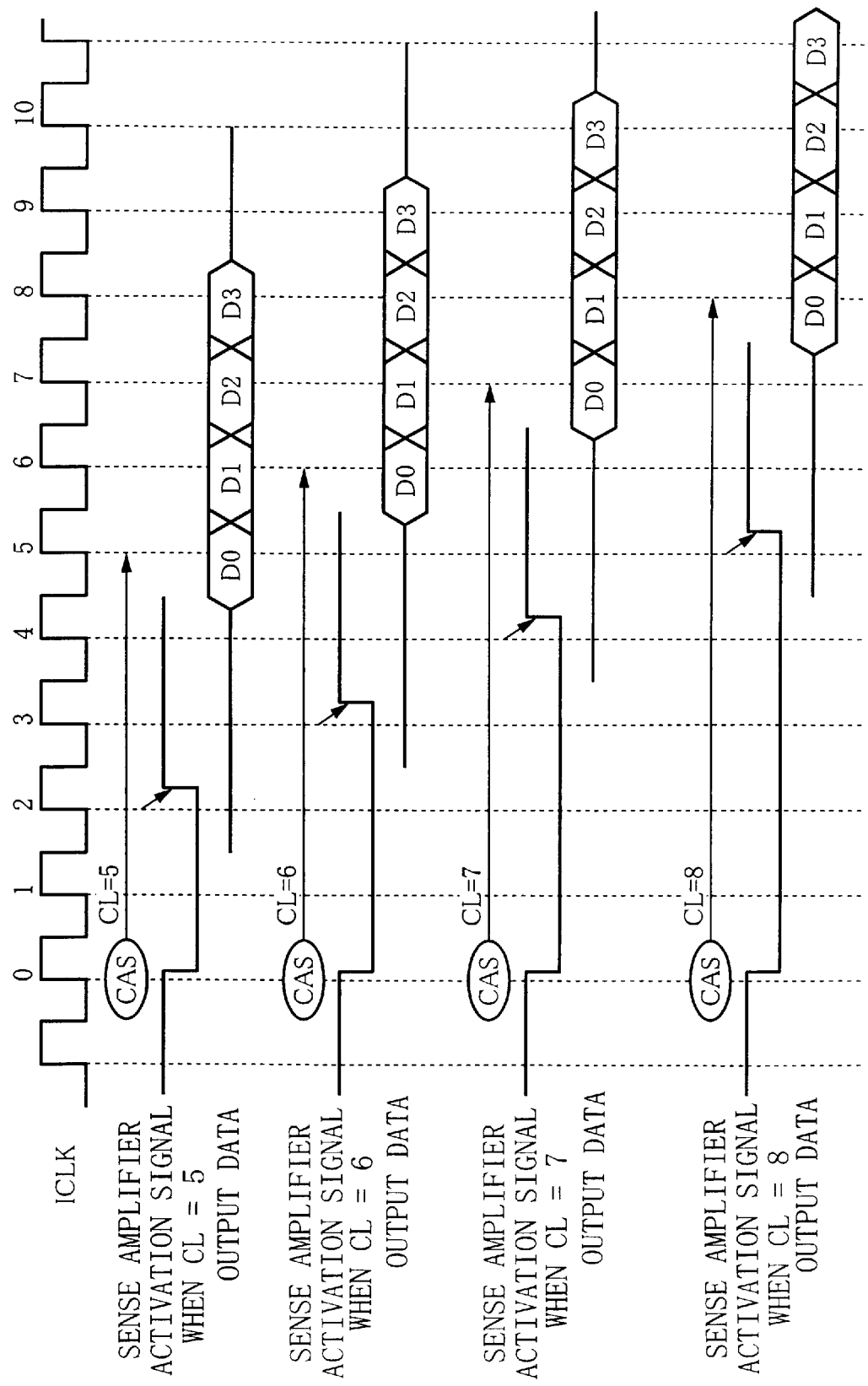
FIG. 6 is a timing diagram showing the read operation of synchronous mask ROM of the embodiment, for several values of CAS latency.
Figure 7:
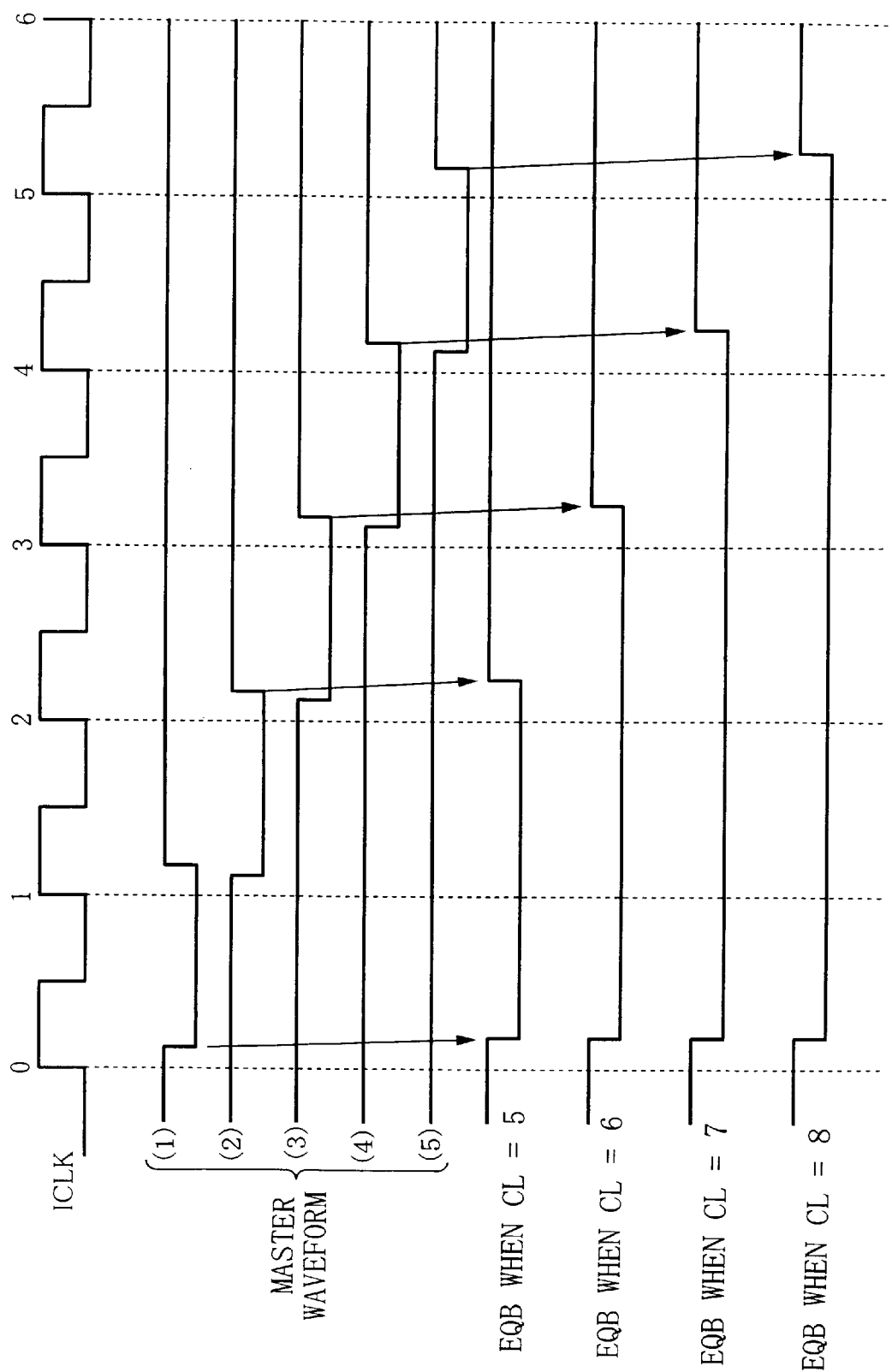
FIG. 7 is a timing diagram showing by reference waveforms how sense amplifier activation signal EQB is generated for several values of CAS latency, in the synchronous mask ROM of the embodiment.

As follows is a description of an embodiment of the present invention with reference to the figures. Here, asynchronous mask ROM is chosen as a specific example of a semiconductor memory device. First, an overview of the present embodiment will be given. As shown in FIG. 6 and FIG. 7 to be mentioned later, with the present embodiment, the arrangement is such that the greater the value of CAS latency is, the longer the active period of the sense amplifier activation signal. In this way, the period corresponding to CAS latency can be optimally utilized, and as the CAS latency becomes greater, the read margin of the sense amplifier can be assured.

(1) STRUCTURE
(a) Overall Structure

Figure 1:
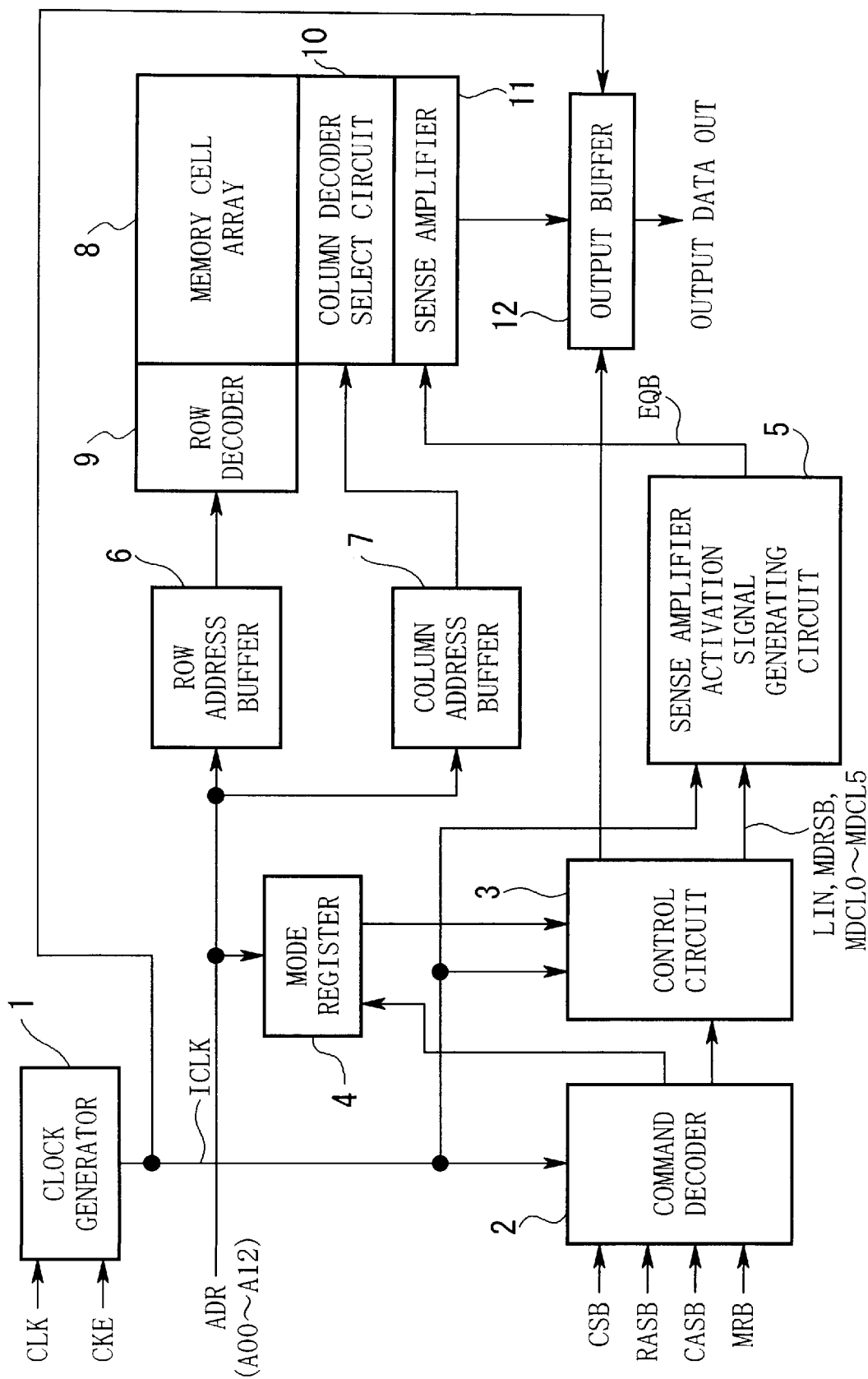
FIG. 1 is a block diagram showing an overall structural example of a synchronous mask ROM, as a semiconductor memory device of an embodiment of the present invention.

FIG. 1 is a block diagram showing the overall structure of a synchronous mask ROM of the present embodiment. Signals and function blocks that are not directly related to the description of the present invention are omitted from the figure. In the figure, an external clock CLK, a clock enable CKE, an address ADR (13 bits from A00 through A12) to be applied to the address bus, a chip select CSB, a row address strobe RASB, a column address strobe CASB, and a mode register enable MRB are all signals to be supplied from outside the synchronous mask ROM.

Conversely, output data, OUT is a signal to be output to outside the synchronous mask ROM. Here, a suffix "B", appended to the end of a signal name indicates a negative logic signal. For example, the row address strobe RASB is the inverse signal of a row address strobe RAS.

The external clock CLK is a standard clock used inside a system that the synchronous mask ROM is used in. When clock enable CKE is "H", a clock generator 1 generates an internal clock ICLK to distribute to each part of the circuit, synchronized to the external clock CLK. Here, when the clock enable CKE is set to "L", the internal clock ICLK is not generated. However, this is only used during power down and the like, which has no direct relation to the present invention. Therefore, in the following description, the arrangement is such that the clock enable CKE is always "H".

A command decoder 2 operates when the chip select CSB is set to "L" to select this synchronous mask ROM. Then, the command decoder 2 fetches the row address strobe RASB, the column address strobe CASB, and the mode register enable MRB, in synchronization with the internal clock ICLK, decodes the assigned command by the combination of levels of each of these signals, and transmits the decoded result to a control circuit 3. At this time, when the assigned command is "mode register setting command" to set the contents of a mode register 4, the command decoder 2 outputs an instruction signal to fetch mode setting data to the mode register 4. Here, the assignment of the mode register setting command is performed by setting each of the chip select CSB, the row address strobe RASB, the column address strobe CSB and the mode register enable MRB, to "L".

The control circuit 3 is a circuit for controlling each operation inside the synchronous mask ROM. To describe only the scope related to the present invention, the control circuit 3, depending on the decoded result of the command given by the command decoder 2, mode setting data maintained in the mode register 4 and the internal clock ICLK, generates a master signal LIN, a mode reset signal MDRSB and mode setting signals MDCL0 through MDCL5. The details of the master signal LIN, the mode reset signal MDRSB, and the mode setting signals MDCL0 through MDCL5 are not mentioned now, but will be mentioned later with reference to FIG. 3 and FIG. 4.

Figures 2A, 2B:
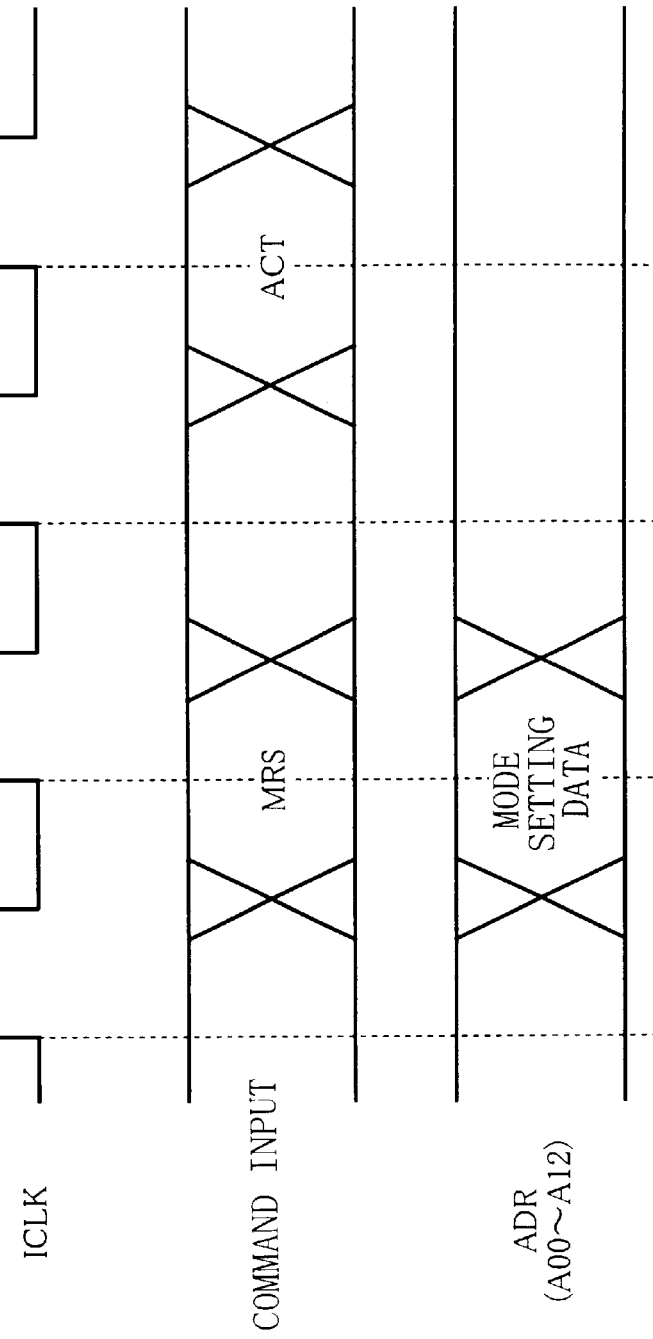
FIG. 2A and FIG. 2B are diagrams for explaining the mode setting operation for synchronous mask ROM of the embodiment.

Then, the mode register 4 fetches the mode setting data applied to the address ADR at the time that a fetch instruction signal is output from the command decoder 2. Here, FIG. 2A shows the mode setting data format, the CAS latency value being assigned to 3 bits of A05 through A03 among 13 bits of address data A00 through A12 that comprise the address ADR. For example, if these 3 bits are B "010" through B "111" (prefix "B" denotes a binary number), the CAS latency values are respectively "4" through "9". Then, the control circuit 3 generates and outputs mode setting signals MDCL0 through MDCL5 corresponding to the CAS latency value from the address data output of the mode register 4.

In this respect, address data A06 is RAS latency, which denotes the period from the time that the row address strobe RASB (corresponding to an "ACT command" mentioned later) is activated to the time that the column address strobe CASB (corresponding to a "READ command" mentioned later) can be made active by the number of clock cycles. Furthermore, address data A02 denotes burst type, and for the order that the address of the burst data is incremented, data output order types corresponding to "sequential" and "interleave" and the like are assigned. Address data A01 and A00 denote data which assign the burst length, and, for example, data corresponding to "4" or "8" is assigned.

On the other hand, FIG. 2B shows the timing where mode setting data is fetched into the mode register 4. As shown in the figure, a "mode register setting command" ("MRS" in the figure), is assigned to the command decoder 2, and at the same time mode setting data is applied to the address ADR. At this time, the command decoder 2 transmits a fetch instruction signal to the mode register 4 at the rising edge of the internal clock ICLK, whereby the mode register 4 fetches the mode setting data therein. Here, "ACT" shown in the figure is a row activate command for activating a word line corresponding to a row address assigned externally. To assign this command, the chip select CSB and the row address strobe RASB are activated, and also a row address corresponding to the word line to be activated is applied to the address ADR.

Referring to FIG. 1 again, a sense amplifier activation signal generating circuit 5, based on the master signal LIN, the mode reset signal MDRSB, the mode setting signals MDCL0 through MDCL5, and the internal clock ICLK, outputs a negative pulse whose width depends on the CAS latency, as a sense amplifier activation signal EQB. The detailed structure of this sense amplifier activation signal generating circuit 5 will be further described later. Next, a row address buffer 6 and a column address buffer 7, buffer and then output the row,address and column address contained in address ADR respectively.

Here, the control circuit 3 and the sense amplifier activation signal generating circuit 5 are in separate blocks so that the characteristic part of the present invention is recognizable at a glance. However, of course the sense amplifier activation signal generating circuit 5 may be incorporated inside the control circuit 3. Furthermore, hereafter the period that the sense amplifier activation signal EQB is active is called the sense amplifier activation period.

In a memory cell array 8, the same memory cells as in a general mask ROM are arranged in the form of a matrix at the locations where word lines and digit lines intersect. A row decoder 9 decodes the row address supplied from the row address buffer 6 and activates the word line corresponding to this row address. Therefore, the row decoder 9 has a word line driver built-in (not shown in the figure). A column decoder select circuit 10 is composed of a column decoder and column switches. The column decoder decodes the column address supplied from the column address buffer 7 and generates a select signal for selecting a digit line corresponding to this column address.

On the other hand, the column switches connect one of the digit lines selected by this select signal to a sense amplifier 11 to be described as follows. When the sense amplifier activation signal EQB is "L", this sense amplifier 11 is activated, senses data stored in the memory cell specified by a row address and a column address via the abovementioned digit line selected by the column decoder select circuit 10, and outputs read data of either "0"/"1" being the sensed result. Then, an output buffer 12 latches the read data transmitted from the sense amplifier 11 in synchronization with the internal clock ICLK, and outputs this as output data OUT to outside via an output pin (not shown in the figure). Furthermore, the output buffer 12, when outputting the data in a burst, outputs the burst data according to an instruction from the control circuit 3.

(b) Sense Amplifier Activation Signal Generating Circuit

Figure 3:
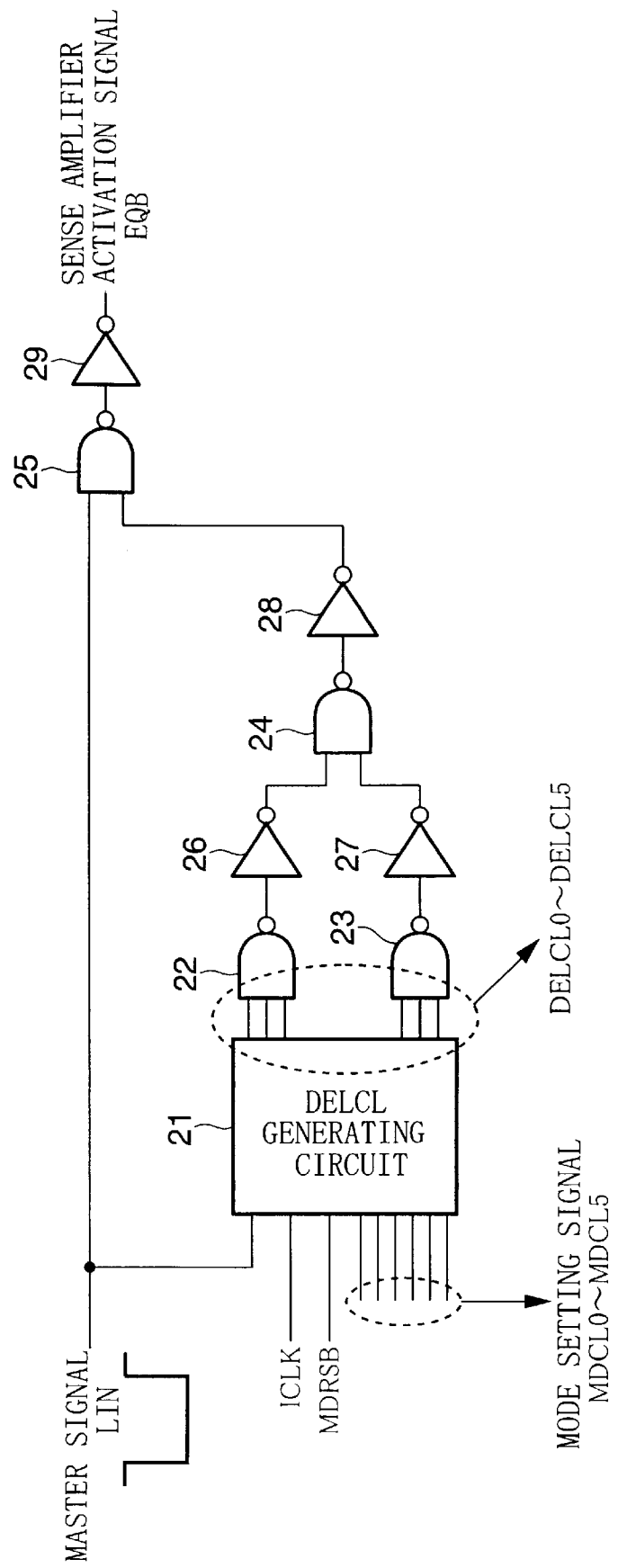
FIG. 3 is a circuit diagram showing a detailed structural example of the sense amplifier activation signal generating circuit 5 shown in FIG. 1.
Figure 4:
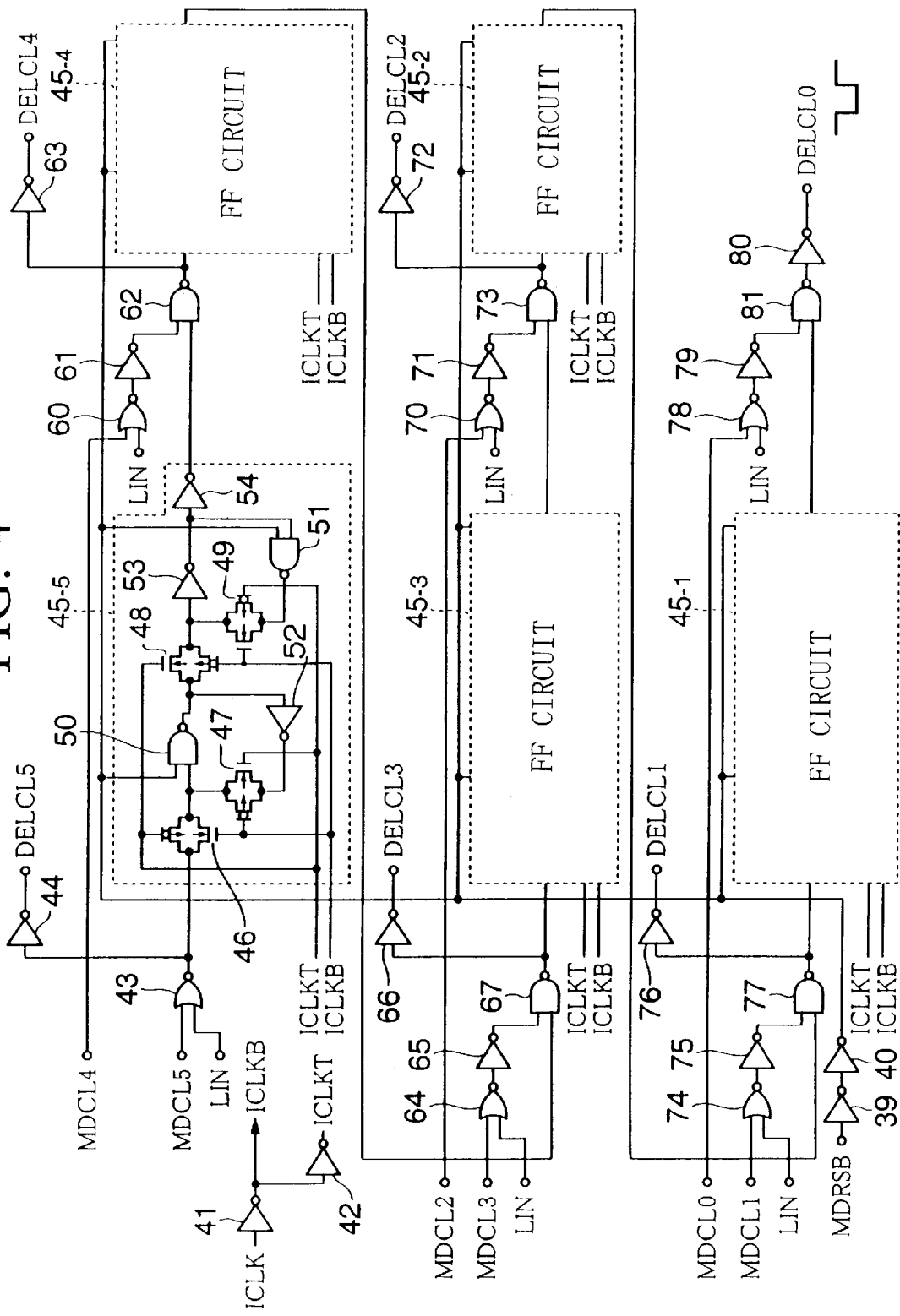
FIG. 4 is a circuit diagram showing a detailed structural example of the reference signal generating circuit 21 shown in FIG. 3.

Next is a description of the detailed structure of the sense amplifier activation signal generating circuit 5 with reference to FIG. 3. Here, the detailed structure of the master signal generating circuit shown by "DELCL generating circuit" in the figure is shown in FIG. 4. The master signal LN is a negative pulse with a width equal to a cycle of the internal clock ICLK, and the control circuit 3 generates the abovementioned master signal LIN negative pulse as a trigger that a READ command is indicated by the command decoder 2. Here, to assign a READ command, the chip select CSB and the column address strobe CASB are set to "L", and also the column address to be read is applied to the address ADR.

The mode setting signals MDCL0 through MDCL5 correspond to CAS latencies "4" through "9" respectively, and only one mode setting signal corresponding to the value of CAS latency is set to "L" level. For example, if a CAS latency of "5" had been set in the mode register 4, only the mode setting signal MDCL1 becomes "L", and the four other signals are all "H". The mode reset signal MDRSB is a signal for initializing a flip flop installed inside the reference signal generating circuit 21 to be described next, and becomes "L" for the fixed period when a "mode register setting command" is input, and "H" for the period other than this.

The reference signal generating circuit 21 ("DELCL generating circuit" in the figure), based on the master signal LIN, the internal clock ICLK and the mode reset signal MDRSB, generates reference signals DELCL0 through DELCL5 corresponding to the CAS latency assigned by the mode setting signals MDCL0 through MDCL5. Here, the relationship between an activated mode setting signal, generated reference signal, and active period of the sense amplifier activation signal EQB will now be further described in detail with reference to the table shown hereunder.

| Activated mode setting signal | Generated reference signal | Active period of sense amplifier activation signal EQB |
| --- | --- | --- |
| MDCL0 | DELCL0 | 1 cycle |
| MDCL1 | DELCL1 - DELCL0 | 2 cycles |
| MDCL2 | DELCL2 - DELCL0 | 3 cycles |
| MDCL3 | DELCL3 - DELCL0 | 4 cycles |
| MDCL4 | DELCL4 - DELCL0 | 5 cycles |
| MDCL5 | DELCL5 - DELCL0 | 6 cycles |

Firstly, if the mode setting signal MDCL0 is active, the master signal LIN is output as a reference signal DELCL0. Furthermore, if the mode setting signal MDCL1 is active, the master signal LIN is output as the reference signal DELCL1, and a signal in which this reference signal DELCL1 is delayed by one cycle of the internal clock ICLK is generated as the reference signal DELCL0.

Moreover, if the mode setting signal MDCL2 is active, the master signal LIN is output as the reference signal DELCL2, a signal in which this reference signal DELCL2 is delayed by one cycle is generated as the reference signal DELCL1, and also a signal in which this reference signal DELCL1 is delayed by another cycle (in other words, the reference signal DELCL2 is delayed by two cycles) is generated as the reference signal DELCL0.

Similarly hereunder, for example, if the mode setting signal MDCL5 is active, the master signal LIN is output as the reference signal DELCL5, and signals obtained by successively delaying this reference signal DELCL5 by one cycle are generated as the reference signals DELCL4 through DELCL0 respectively.

NAND gates 22 through 25 and inverters 26 through 29, by calculating the logical product of the master signal LIN and the reference signals DELCL0 through DELCL5 (in this case, logical sum because these signals are all negative pulses), combine all the signals and generate a sense amplifier activation signal EQB, being the negative pulse obtained from this computation.

Accordingly, if the mode setting signal MDCL1 is active, from the time that the master signal LIN is active, a negative pulse with twice the cycle width of the internal clock ICLK is generated as the sense amplifier activation signal EQB. Similarly hereunder, when each one of the mode setting signals MDCL2 through MDCL5 is active, from the time that the master signM LIN is active, a negative pulse with a width of "3" cycles through "6" cycles respectively is generated as the sense amplifier activation signal EQB. Here, if the mode setting signal MDCL0 is active, a signal of "1" cycle width of the internal clock ICLK is output without any combined operations.

(c) Reference Signal Generating Circuit

Next is a description of a detailed structural example of the master signal generating circuit 21 with reference to FIG. 4. Firstly, inverters 39 and 40 buffer the mode reset signal MDRSB. Next, an inverter 41 generates clock ICLKB being an inverted signal of the internal clock ICLK, and an inverter 42 further inverts this clock ICLKB to generate a clock ICLKT in phase with the internal clock ICLK. Then, a NOR gate 43 inverts the master signal LIN and outputs it only when the mode setting signal MDCL5 is active ("L"). An inverter 44 further inverts the output from the NOR gate 43 to generate the reference signal DELCL5. That is to say, if the mode setting signal MDCL5 is active, the master signal LIN is output as the reference signal DELCL5.

Then, numeral 45-5 denotes a flip flop circuit having a master-slave flip flop (abbreviated hereunder to "MS-FF"), and is provided with transfer gates (abbreviated hereunder to "TG") 46 through 49, NAND gates 50 and 51, and inverters 52 through 54. The circuit excluding the inverter 54 comprises the MS-FF. The inverter 54, after inverting the output from this MS-FF, outputs it to the next stage circuit. Furthermore, the TG 46, the TG 47, the NAND gate 50 and the inverter 52 comprise the master flip flop, and the TG 48, the TG 49, the NAND gate 51 and the inverter 53 comprise the slave flip flop.

Here, with the TG 46 and the TG 49, clock ICLKT is supplied on the pMOS (metal oxide semiconductor) transistor side, and clock ICLKB is supplied on the nMOS transistor side. Whereas, with the TG 47 and the TG 48, clock ICLKT is supplied on the nMOS transistor side, and clock ICLKB is supplied on the pMOS transistor side.

Moreover, since the other flip flop circuits 45-1 through 45-4 have exactly the same internal structure as the flip flop circuit 45-5, the detailed structure of these flip flop circuits 45-1 through 45-4 is not shown in the figure.

When the mode reset signal MDRSB is "L" for a fixed period of time by the mode register setting command input, the NAND gate 50 forces the output to "H" to initialize the master flip flop. At the same time, the NAND gate 51 forces the output to "H" to initialize the slave flip flop at the time of the subsequent falling edge of the internal clock ICLK. As opposed to the above, if the mode reset signal MDRSB is set to "H", since the NAND gates 50 and 51 are equivalent to inverters, the flip flop circuit 45-5 functions as a simple MS-FF. That is to say, the flip flop circuit 45-5, latches the output signal from the NOR gate 43 at the rising edge of the internal clock ICLK and outputs the signal.

Next, a NOR gate 60, Which plays the same role as the NOR gate 43, inverts the master signal LIN and outputs it only in the case where the mode setting signal MDCL4 is active. Furthermore, an inverter 61 and a NAND gate 62 are for combining the output from the NOR gate 60 and the output from the flip flop circuit 45-5. In fact, since the CAS latency value is constant unless the mode register setting command changes it, in the process of one read operation for example, the mode setting signals MDCL4 and MDCL5 cannot be active at the same time. Consequently, in practice, the NAND gate 62 transfers either the output from the inverter 61 or the output from the flip flop circuit 45-5 to the next stage flip flop circuit 45-4. Furthermore, an inverter 63, which plays the same role as the inverter 44, inverts the output from the NAND gate 62 and outputs this as the reference signal DELCL4.

Next, a circuit comprising a flip flop circuit 45-3, a NOR gate 64, inverters 65 through 66, and a NAND gate 67, has the same function as the circuit comprising the flip flop circuit 45-5, the NOR gate 60, the inverter 61, the NAND gate 62 and the inverter 63. The only differences of the former from the latter are that instead of the mode setting signal MDCL4, a mode setting signal MDCL3 is to be input, and instead of the reference signal DELCL4, a reference signal DELCL3 is to be output. Accordingly, if the mode setting signal MDCL3 is active, the master signal LIN is output as reference signal DELCL3 via the NOR gate 64, the inverter 65, the NAND gate 67 and the inverter 66.

On the other hand, if the mode setting signal MDCL4 or MDCL5 is active, since the mode setting signal MDCL3 is inactive at this time, the flip flop circuit 45-4 latches the output from the NAND gate 62 of the previous stage in synchronization with the internal clock ICLK and outputs it, and this is output as the reference signal DELCL3 via the NAND gate 67 and the inverter 66.

The same construction is used for the circuit comprising a flip flop circuit 45-3, a NOR gate 70, inverters 71 and 72, and a NAND gate 73, the circuit comprising a flip flop circuit 45-2, a NOR gate 74, inverters 75 and 76, and a NAND gate 77, and the circuit comprising a flip flop circuit 45-1, a NOR gate 78, inverters 79 and 80 and a NAND gate 81.

By adopting the circuit construction as above, in the case where the mode setting signal MDCL0 is made active, a negative pulse on the master signal LIN is output as the reference signal DELCL0 via the NOR gate 78 through the inverter 80. Furthermore, in the case where the mode setting signal MDCL1 is made active, a negative pulse on the master signal LIN is output as the reference signal DELCL1 via the NOR gate 74 through the NAND gate 77 and the inverter 76. Furthermore, the inverted signal of the master signal LIN, after being latched by the flip flop circuit 45-1 and further inverted, is output as the reference signal DELCL0 via the NAND gate 81 and the inverter 80.

The same applies in the case where the mode setting signals MDCL2 through MDCL5 are activated. For example, in the case where the mode setting signal MDCL5 is activated, a negative pulse given to the master signal LIN is output as the reference signal DELCL5 via the NOR gate 43 and the inverter 44. Furthermore, the master signal LIN inverted by the NOR gate 43 is output as the reference signal DELCL4 via the NAND gate 62 and the inverter 63, after being latched by the flip flop circuit 45-5, and hereafter, in synchronization with the internal clock ICLK, is sequentially latched and transmitted by the flip flop circuits 45-4 through 45-1, and negative pulses are simultaneously generated as the reference signals DELCL3 through DELCL0.

(d) Sense Amplifier

Figure 5:
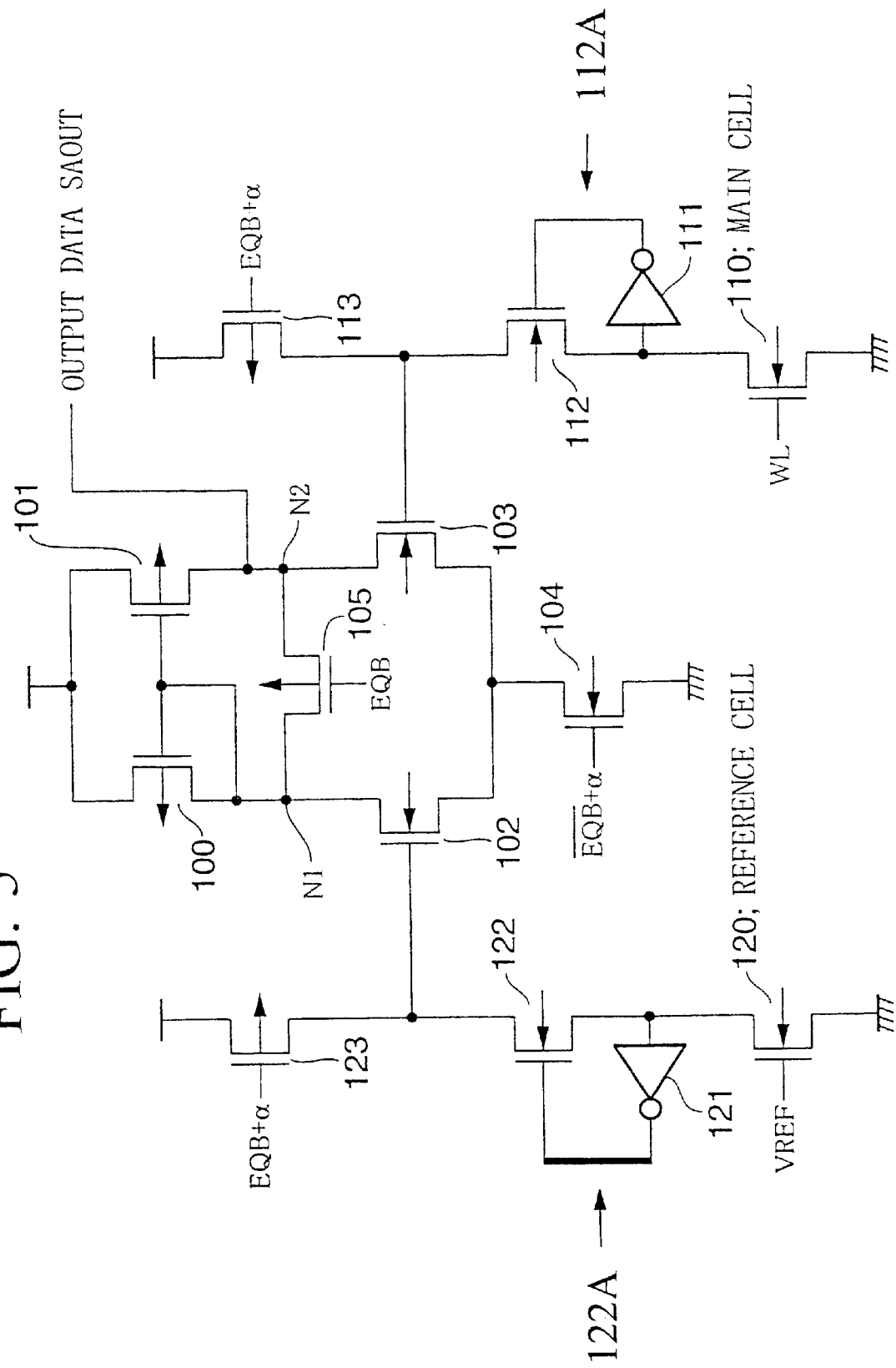
FIG. 5 is a circuit diagram showing a detailed structural example of the sense amplifier 11 shown in FIG. 1.

Next is a description of the detailed construction of the sense amplifier 11 shown in FIG. 1. Here, FIG. 5 shows an example of the construction of a current detection type sense amplifier.

Firstly, pMOS transistors (abbreviated hereunder to "Tr") 100 and 101, and nMOS Tr 102 through 104, which are so-called current mirror type differential amplifiers, compare the voltage applied to the Tr 102 gate with the voltage applied to the Tr 103 gate, and output either "H" or "L" to output data SAOUT depending on the comparison result. Here, a waveform whose valid period is longer by a predetermined time a than the inverted signal of the sense amplifier activation signal EQB is applied to the Tr 104 gate.

Furthermore, a pMOS Tr 105 is an equalizing transistor, which short-circuits a node N1 and a node N2, being differential output terminals to make them the same electric potential when the sense amplifier activation signal EQB is "L". A main cell (normal cell) 110 composed of nMOS transistors is an object memory cell to be read, selected from the memory cell array 8 (refer to FIG. 1) by a row address and a column address, and a word line WL is connected to its gate. The main cell 110, depending on the data ("1" or "0") that it holds itself, is switched to an on cell (that is, the transistor of the main cell 110 is in an on state) or an off cell (that is, the transistor of the main cell 110 is in a cut-off state).

If the main cell 110 is an on cell, current flows in a digit line connected to the main cell 110 by activating the word line WL. Conversely, if the main cell 110 is an off cell, current does not flow in the digit line. Here, digit lines lying between the main cell 110 and the sense amplifier, and a column decoder select circuit are omitted in the figure.

Next, an inverter 11, when the main cell 110 is an on cell and "L" is applied to its own input (inverter 111), applies "H" to the Tr 112 gate of the NMOS, and turns this Tr 112 on. Otherwise, the inverter 11 applies "L" to the Tr 112 gate, and turns this Tr 112 off. Thus, inverter 111 and Tr 112 form a current detector 112A.

Next, Tr 113 is a bias stage pMOS transistor, and a waveform whose valid period is longer by a predetermined α than the sense amplifier activation signal EQB is applied to the gate. Next, a reference cell 120 is an nMOS transistor having the same characteristics as the main cell 110, and reference voltage VREF generated by a reference voltage generating circuit, which is not shown in the figure, is applied to the gate. Here, when the reference voltage VREF is set, the arrangement is such that the mean voltage (that is, (Von+Voff/2) between the voltage (voltage Von, for example) applied to the Tr 103 gate when the main cell 110 is an on cell, and the voltage (voltage Voff, for example) applied to the Tr 103 gate when the main cell 110 is an off cell, is applied to the Tr 102 gate. Here, the inverter 121, the nMOS Tr 122, and the pMOS Tr 123 play the same roles as the inverter 111, the Tr 112, and the Tr 113 respectively. Thus, inverter 121 and Tr 122 form a current detector 122A.

(2) OPERATION

Next is a description of the operation in the case of reading out data from a synchronous mask ROM wherein the abovementioned construction is adopted, with reference to the timing diagrams shown in FIG. 6 and FIG. 7. Here, in these figures, of the possible values "4" through "9" of CAS latency, operation waveforms are shown only for "5" through "8". Furthermore, since the time when a READ command is input is a reference for CAS latency, in these figures, the arrangement is such that the timing when a READ ("CAS" in the figure) command is given, this is shown as the zeroth clock.

(a) CAS Latency="5"

To begin with, the case where CAS latency is set to a value of "5" will be described. Firstly, to set CAS latency and the like, an MRS command is input, and also mode setting data (refer to FIG. 2) is assigned. Here, it is assumed that the assignments are RAS latency is "2", CAS latency is "5", burst type is "sequential", and burst length is "4". Then, the command decoder 2 decodes the abovementioned command and performs a fetch instruction, so that the mode register 4 fetches the abovementioned mode setting data from the address ADR.

Furthermore, the control circuit 3, receiving the decoded result generated by the command decoder 2, fetches the mode setting data from the mode register 4, and sets the mode setting signal MDCL1, corresponding to the CAS latency of "5", to "L". At the same time, the control circuit 3 sets the mode reset signal MDRSB to "L" for a fixed time. In this manner, the reference signal generating circuit 21 inside the sense amplifier activation signal generating circuit 5 initializes the MS-FF that is built into it.

Next, as shown in FIG. 2B, an ACT command is input at the time that two cycles, for example, have passed since an MRS command was issued. At this time, a row address has been applied to the address ADR. This is applied to the row decoder 9 via the row address buffer 6, and the corresponding word line is activated. Here, since "2" has been assigned as RAS latency, later at the time of the zeroth clock of the internal clock ICLK (refer to FIG. 6 or FIG. 7) being two cycles after the ACT command had been input, a READ command ("CAS" in the figure) is input.

At this time, since the column address is applied to the address ADR, this column address is transmitted to the column decoder select circuit 10 via the column address buffer 7. In this manner, the column decoder select circuit 10 connects a digit line corresponding to the assigned row address to the sense amplifier 11.

Furthermore, the control circuit 3, when receiving a READ command, generates a negative pulse with a width of one cycle on the master signal LIN, and supplies it to the sense amplifier activation signal generating circuit 5. Then the sense amplifier activation signal generating circuit 5 uses the falling edge of the master signal LIN as a trigger and generates a negative pulse on the reference signal DELCL 1 (corresponding to reference waveform (1) in FIG. 7). In this manner, as shown in FIG. 6, the sense amplifier activation signal EQB is changed from "H" to "L" in synchronization with the rising edge of the zeroth clock of the internal clock ICLK, and the sense amplifier 11 shifts to an active state.

Moreover, since the sense amplifier activation signal generating circuit 5 delays the master signal LN by one cycle in the flip flop circuit 45-1, a negative pulse is generated on the reference signal, DELCL0 in synchronization with the rising edge of the first clock pulse of the internal clock ICLK (corresponding to reference waveform (2) in FIG. 7). As a result, as shown in FIG. 6 and FIG. 7, a negative pulse with a two cycle width is generated on the sense amplifier activation signal EQB, the sense amplifier activation signal EQB returns to "H" in synchronization with the rising edge of the second clock pulse of the internal clock ICLK, and the sense amplifier 11 returns to a deactivated state.

Here, the sense amplifier 11 performs an equalizing operation and sense operation during the two cycles when the sense amplifier activation signal EQB is "L", and senses the data that the memory cell defined by the abovementioned row address and column address holds. When the sense amplifier 11 completes a sense operation in this manner, data stored in the memory cell is transferred to the output buffer 12 from the sense amplifier 11. The control circuit 3 synchronizes at the rising edge of the fourth clock pulse of the internal clock ICLK according to the CAS latency of "5", and transmits a fetch instruction to the output buffer 12.

In this manner, the output buffer 12 latches data "D0" transmitted from the sense amplifier 11, and outputs it as an output data OUT to outside the synchronous mask ROM via the output pin. Thus, firstly data "D0" is output around the falling edge of the fourth clock pulse. Similarly to the case of data "D0", hereafter data "D1" through "D3" are sequentially output in synchronization with the internal clock ICLK.

As mentioned above, in the case of a CAS latency of "5", data starts being output at the fourth clock pulse being one cycle before the fifth clock pulse. As a result, the time from the rising edge of the fourth clock pulse to valid data output is an access time from the synchronous mask ROM specification. Therefore, data from the sense amplifier 11 must reach the output buffer 12 by the time of the rising edge of the fourth clock pulse.

Here, the operation of a sense amplifier having the structure shown in FIG. 5 is as follows. Firstly, in the period until time t50 (refer to FIG. 8) when the sense amplifier activation signal EQB is "H", all of Tr 104, 105, 113 and 123 are cut off, so that the sense amplifier does not operate. Afterwards, when the sense amplifier activation signal EQB becomes "L" at time t50 corresponding to the rising edge of the zeroth clock pulse, the Tr 104 conducts so that the differential amplifier comprising the sense amplifier begins operating. Furthermore, the Tr 105 switches to a conductive state so as to short-circuit the node N1 and the node N2 shown in FIG. 5, thus the equalizing operation is carried out. Moreover, both the Tr 113 and 123 are in a conductive state, and hence a bias corresponding to the power supply potential is supplied to the gates of Tr 102 and 103.

Moreover, at this point, the word line WL is activated by the ACT command, and the reference voltage VREF is supplied to the gate of the reference cell 120. Therefore, if the main cell 110 is an on cell, this main cell 110 conducts so that the input of the inverter 111 becomes "L", and "H", being the output of the inverter 111, is applied to the gate of the Tr 112, which conducts. As a result, the gate voltage of the Tr 103 becomes almost "0".

Conversely, if the main cell 110 is an off cell, this main cell 110 becomes non-conducting. Therefore, when the input node of the inverter 111 is charged to increase the potential via the Tr 113 and Tr 112, the output of the inverter 111 becomes "L" and the Tr 112 stops conducting. Accordingly, in this case, a bias voltage supplied via the Tr 113 is applied to the Tr 103 gate. On the other hand, similar operation to the main cell side is performed on the reference cell side. The mean voltage between the voltages of the on cell gate and the off cell gate is applied to the Tr 102 gate. As a result, if the voltage on the main cell 110 side is greater than or equal to the voltage on the reference cell 120 side, the differential amplifier outputs "H" ("1"), otherwise "L" ("0"), as output data SAOUT.

Figure 8:
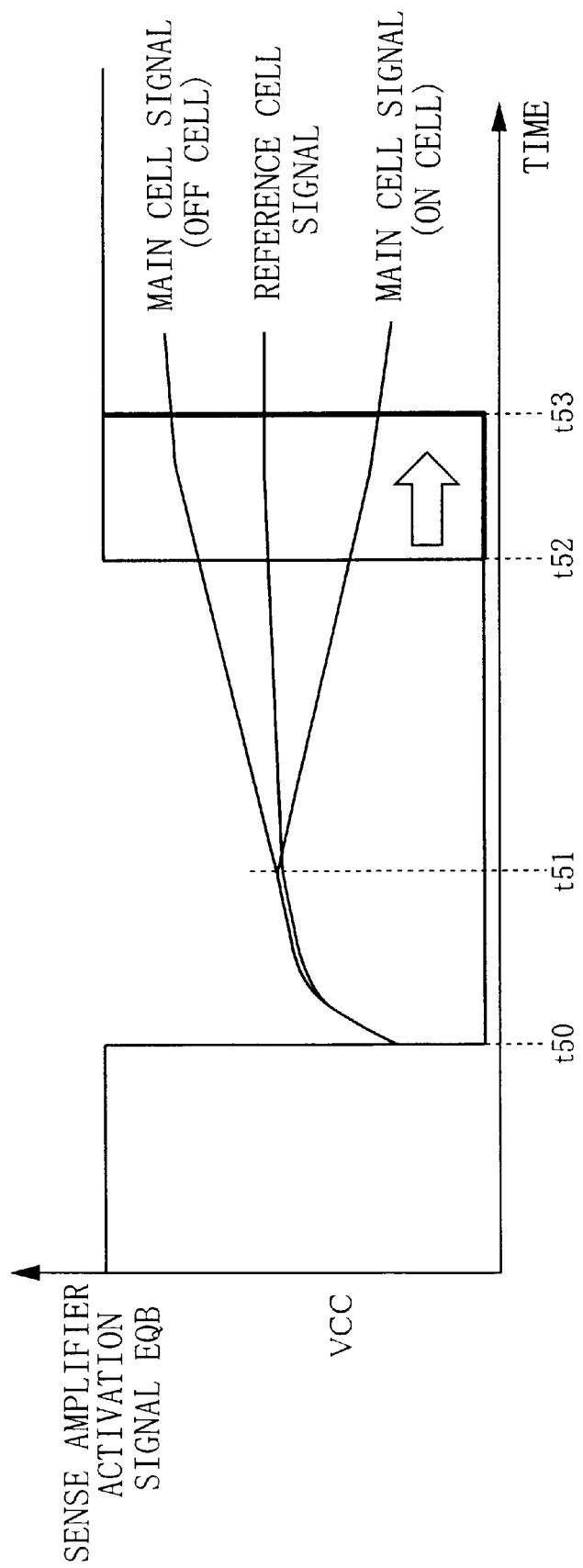
FIG. 8 is a timing diagram showing the detailed operation of the sense amplifier 11 shown in FIG. 1 and FIG. 5.

In a sense operation process like that above, voltage waveforms applied to each gate of the Tr 102 and Tr 103 are shown in FIG. 8 together with the sense amplifier activation signal EQB. In the figure, the "reference cell signal" is the voltage waveform of the Tr 102 gate corresponding to the reference cell 120 (refer to FIG. 5), the "main cell signal (OFF cell)" is the voltage waveform of the Tr 103 gate when the main cell 110 is an off cell, and the "main cell signal (ON cell)" is the voltage waveform of the Tr 103 gate when the main cell 110 is an on cell. As mentioned above, when the sense amplifier activation signal EQB is changed to "L" from "H" at time t50, since the selected main cell and the reference cell are precharged, all of the three voltage waveforms gradually rise. However, at first, the shapes of all the voltage waveforms are almost the same.

However, the difference between the three voltage waveforms starts to become evident from around the time t51. The voltage waveform of the main cell signal (OFF cell) gradually increases over time, the voltage of the reference cell signal becomes almost constant, independent of time, and the voltage waveform of the main cell signal (ON cell) gradually decreases over time. Therefore, as shown in FIG. 8, the separation between the main cell signal (OFF cell) and the main cell signal (ON cell) from the reference cell signal increases over time. Naturally, the wider the separation between the main cell signals (OFF cell, ON cell) and the reference cell signal is, the wider the read margin that can be obtained, and hence it is an advantage for reading. Accordingly, to consider only the read margin, the later the duration before the sense amplifier activation signal EQB returns to "H" (for example time t53 rather than time t52), the wider the read margin that can be secured.

However, when deciding on the timing when the sense amplifier activation signal EQB is returned to "H", consideration must be given to the time (hereunder called "output time") that it takes for data stored in the memory cell sensed by the sense amplifier 11 to be transmitted to the output pin via the output buffer 12. That is because since there must necessarily be a minimum time as the output time, if the rising edge of the sense amplifier activation signal EQB is delayed, the access time of the synchronous mask ROM is rate determined by the output time. As a result, it is desirable that the timing for raising the sense amplifier activation signal EQB is set at a timing that is the output time before the rising edge timing determined by CAS latency.

For the above reason, with the present embodiment, the arrangement is such that in the case where CAS latency is "5", the timing when the sense amplifier activation signal EQB is returned to "H" is, set to the rising edge of the second clock pulse, and also the period after this timing is allocated to the output time. Accordingly, if the output time can be shorter than this, there is no problem even if the timing where the sense amplifier activation signal EQB is changed to "H" is later than the rising edge of the second clock pulse, to enable the read margin to be widened further.

Here, the voltage waveforms of the main cell signal (OFF cell, ON cell) eventually reach saturation, and the situation is such that no further change in the voltage can be observed even if the sense amplifier activation signal EQB is maintained to be "L". However, this situation occurs after a considerable period of time. Therefore, in the case where the CAS latency is within a range of around "4" through "9" as in the present embodiment, even in the case where saturation of the main cell signal (OFF cell, ON cell) can be predicted, the sense amplifier activation signal EQB should be maintained at "L" until the latest timing possible so that reading can be performed more accurately.

(b) CAS Latency="6"

Since the operation in the case where the CAS latency value is other than "5" is almost the same as the abovementioned, only the points of difference will be briefly mentioned. In the case where the CAS latency value is set to "6", the mode setting signal MDCL2 becomes "L" instead of the mode setting signal MDCL1. In this case, a negative pulse is also generated on the master signal LIN at the zeroth clock pulse of the internal clock ICLK, and the sense amplifier activation signal EQB is transitioned to "L". That is to say, in this case, with the falling edge of the master signal LIN as a trigger, a negative pulse (corresponding to reference waveform (1) in FIG. 7) is generated on the reference signal DELCL 2 from the master signal LIN.

Next, a negative pulse (corresponding to reference waveform (2) in FIG. 7) is generated on the reference signal DELCL1 from the rising edge of the first clock pulse, and a further negative pulse (corresponding to reference waveform (3) in FIG. 7) is generated on the reference signal DELCL0 from the rising edge of the second clock pulse. As a result, the sense amplifier activation signal generating circuit 5 generates a negative pulse with a three cycle width as the sense amplifier activation signal EQB. In this manner, the sense operation is performed until the sense amplifier activation signal EQB returns to "H" at the rising ledge of the third clock pulse. Following this, the same output operation as mentioned above is performed, and data transferred from the sense amplifier 11 in synchronization with the rising edge of the fifth clock pulse is latched by the output buffer 12, and output from the sixth clock cycle pulse to outside.

(c) CAS Latency="7" through "9" and "4"

Exactly the same occurs for the cases where CAS latency values are "7" and "8". Firstly, in the case where the CAS latency value is "7", the mode setting signal MDCL3 becomes "L". Therefore, a negative pulse (corresponding to reference waveform (1) in FIG. 7) is generated on the reference signal DELCL3 from the master signal LIN generated at the zeroth clock pulse, and the sense amplifier activation signal EQB is transitioned to "L". After this, negative pulses (respectively corresponding to reference waveforms (2) through (4) in FIG. 7) are respectively generated on the reference signals DELCL2 through DELCL0 from the rising edges of the first clock pulse through the third clock pulse, and a negative pulse with a width of four cycles is generated as the sense amplifier activation signal EQB. As a result, the sense amplifier activation signal EQB returns to "H" in synchronization with the rising edge of the fourth clock pulse, and on the system side, data is available from the rising edge of the seventh clock pulse in a subsequent output operation.

Furthermore, in the case where the CAS latency value is "8", the mode setting signal MDCL4 becomes "L". Therefore, a negative pulse (corresponding to reference waveform (1) in FIG. 7) is generated on the reference signal DELCL4 from the master signal LIN generated at the zeroth clock pulse, and the sense amplifier activation signal EQB is transitioned to "L". After this, negative pulses (respectively corresponding to reference waveforms (2) through (5) in FIG. 7) are respectively generated on the reference signals DELCL3 through DELCL0 from the rising edges of the first clock pulse through the fourth clock pulse, and a negative pulse with a width of five cycles is generated as the sense amplifier activation signal EQB. As a result, the sense amplifier activation signal EQB returns to "H" in synchronization with the rising edge of the fifth clock pulse, and data is available from the rising edge of the eighth clock pulse in a subsequent output operation.

Here, the cases where the CAS latency is "4" and "9" are not shown in the figure specifically. However, the operation can be easily understood from the abovementioned description. That is to say, in the case where the CAS latency value is "4", since the mode setting signal MDCL0 becomes "L", a negative pulse with a width of one cycle is generated on the sense amplifier activation signal EQB, and the sense amplifier activation signal EQB returns to "H" at the rising edge of the first clock pulse. Furthermore, in the case where the CAS latency is "9", since the mode setting signal MDCL5 becomes "L", a negative pulse with a width of six cycles is generated on the sense amplifier activation signal EQB, and the sense amplifier activation signal EQB returns to "H" at the rising edge of the sixth clock pulse.

As stated above, with the present embodiment, at the time that a READ command is given in synchronization with the internal clock ICLK, the sense amplifier activation signal EQB is set to "L" independent of the CAS latency value, whereas, when returning the sense amplifier activation signal EQB to "H", it is returned by timing depending on the CAS latency value, in synchronization with the internal clock ICLK. At that time, the arrangement is such that the greater the CAS latency value, the later the timing that the sense amplifier activation signal EQB returns to "H", which makes the sense amplifier activation period longer. By doing this, as CAS latency becomes greater, the read margin that can be obtained increases by a corresponding amount, which is advantageous to reading.

Figure 9:
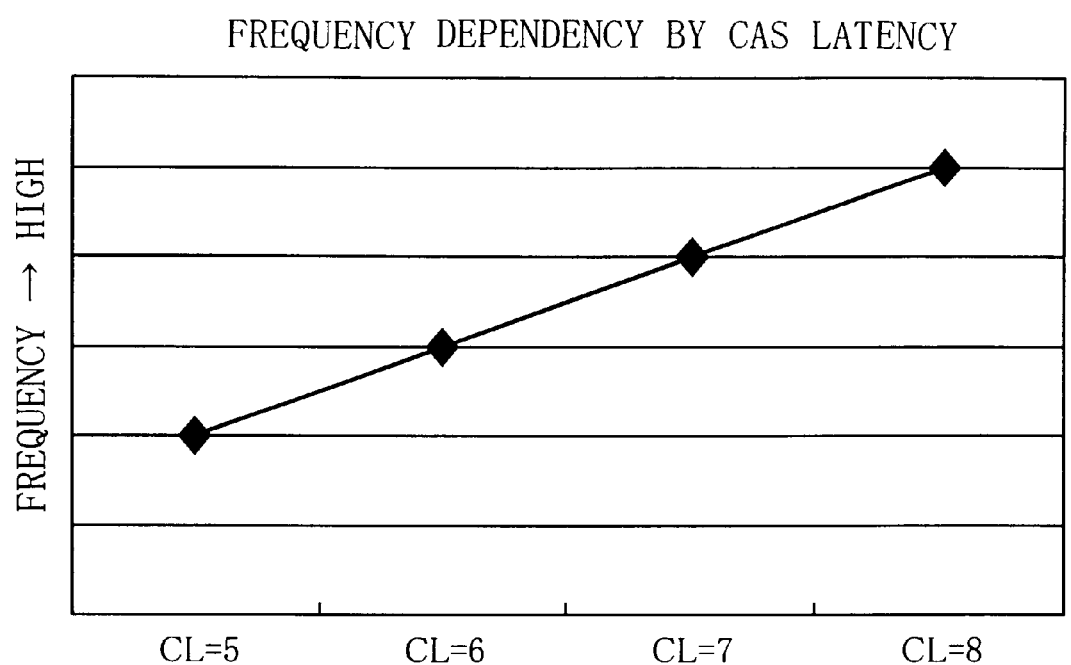
FIG. 9 is a graph showing the relationship between CAS latency and possible operating frequencies of the embodiment.
Figure 10:
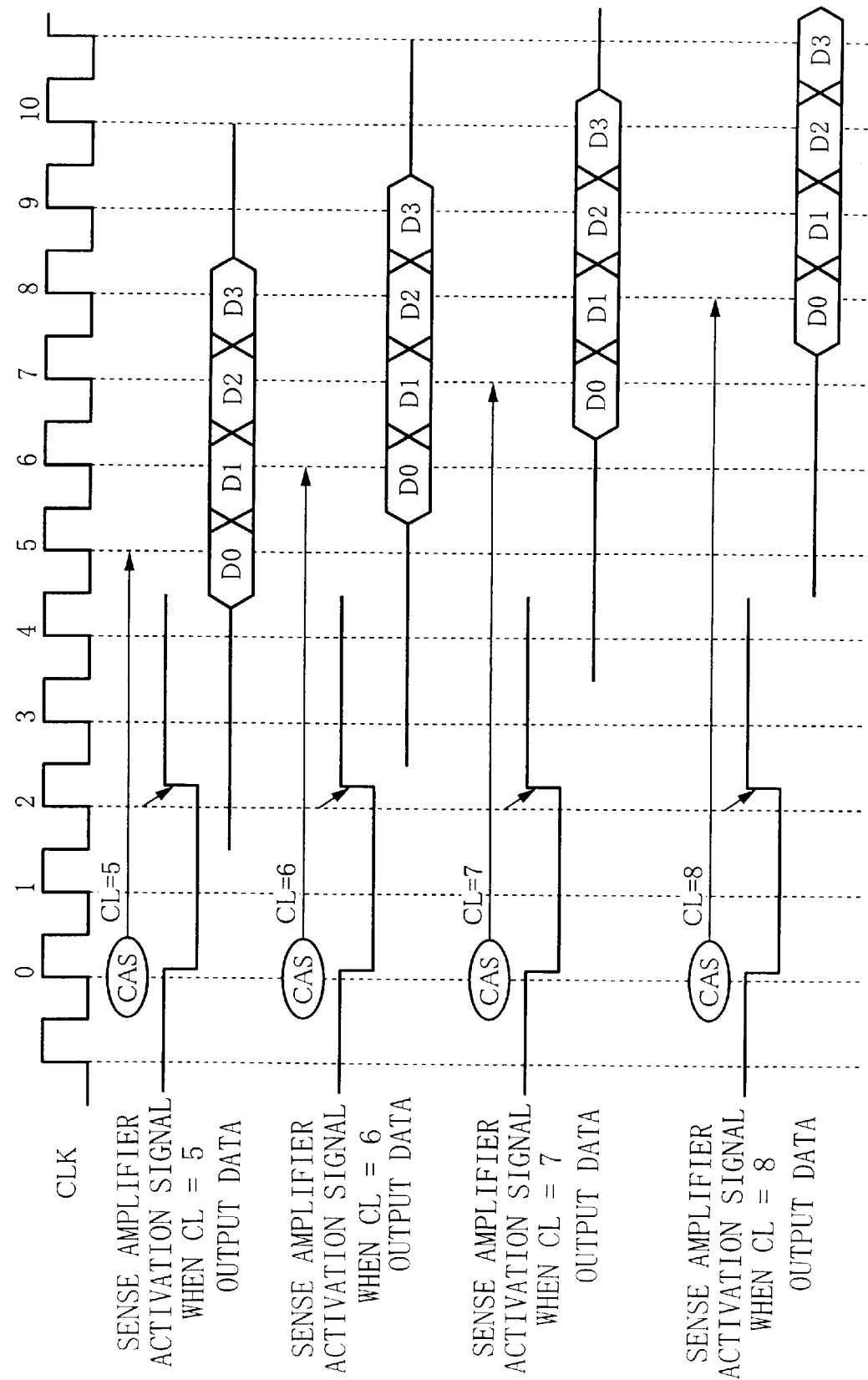
FIG. 10 is a timing diagram showing the read operation of synchronous mask ROM in related art for several values of CAS latency.

Here, FIG. 9 shows a chart of the relationship between the upper clock frequency limit for performing read operations and the CAS latency value. With the present embodiment, the greater the CAS latency, the longer the sense amplifier activation period. Therefore, as CAS latency increases, read operations are possible even with higher clock frequencies. Accordingly, as shown in the figure, the relationship between the CAS latency value and the upper limit of the clock frequency is almost a linear shape, and the greater the CAS latency value is, the higher the upper limit of the clock frequency can be raised.

Furthermore, with the present embodiment, the sense amplifier activation signal EQB is generated in synchronization with the external clock CLK (and therefore with the internal clock ICLK). As a result, in the case where the frequency of the external clock CLK is changed, the sense amplifier activation period is also extended and contracted following the frequency change.

(3) MODIFIED EXAMPLE

In the abovementioned description, the CAS latency values are "4" through "9". However, this is only one example, and any other number is possible. Furthermore, with the abovementioned description, the arrangement is such that each time CAS latency is increased by "1", the sense amplifier activation period is also extended by one cycle. However, the arrangement does not necessarily need to be like this. For example, the arrangement may be such that, when the CAS latency value is "4" or "5", the width is one cycle for both, and when the CAS latency value is greater than or equal to "6", additional cycles are added as mentioned above. Moreover, for example, the arrangement may be such that when the CAS latency value is "4", the width is one cycle, when the CAS latency value is "5" or "6", the width is two cycles for both, and when the CAS latency value is greater than or equal to "7", additional cycles are added as mentioned above. Moreover, for example, the arrangement may be such that, when the CAS latency value is up to "7", additional cycles are added as mentioned above, and when the CAS latency value is "8" or "9", the same number of cycles are used.

Furthermore, in the abovementioned description, a synchronous mask ROM is used as an example. However, the present invention is not limited to this. That is to say, a semiconductor memory device with a construction in which the read time can be changed corresponding to external commands would be applicable to not only a synchronous type semiconductor memory device such as SDRAM, but also to various other semiconductor memory devices whether synchronous or asynchronous, or whether ROM or RAM. Moreover, as mentioned above, it is applicable beyond those that transfer data in synchronization with the rising edge of the clock, and to semiconductor memory devices in which DDR (Double Data Rate) techniques for transferring data at both the rising edge and falling edge of the clock are adopted, and the like.

For example, although there is the following structural difference between the abovementioned synchronous mask ROM and DRAM, acknowledging this difference, the present invention is also applicable to DRAM and the like. Firstly, the data path for reading is different between synchronous mask ROM and DRAM. That is to say, with synchronous mask ROM, at the time that the CAS signal (READ command) is activated, the object memory cell to be read is uniquely specified. Therefore, at this time, at the first time the sense amplifier is operated, a digit line is selected and the object memory cell to be read is connected to the sense amplifier. Then, data is sensed by detecting whether current flows to the object memory cell to be read by the sense amplifier. Accordingly, with synchronous mask ROM, one sense amplifier is adequate per one bit of output data.

Conversely with DRAM, at the time that the RAS signal is activated, a word line is activated, all sense amplifiers are operated, and the data stored in all of the memory cells connected to this word line are sensed and latched. After that, at the time that the CAS signal is activated, the sense amplifier data corresponding to the assigned column address is selected to be output. Accordingly, with DRAM, the same number of sense amplifiers is required as the number of digit lines. This is because, in general, DRAM memory cells are of a destructive readout type, and the data latched by the sense amplifiers are required to be rewritten to the memory cells.

Furthermore, there is also the following difference corresponding to the above difference. That is to say, with synchronous mask ROM, the periods of the equalizing operation and sense operation overlap. Conversely, with DRAM, the period of precharge and equalizing operation and the period of sense operation are different. The precharge operation for the digit line is performed in advance, a pair of complementary digit lines are short-circuited to make them the same electric potential, and hence the equalizing operation is performed. After the precharge and equalizing operation is completed, the word line is activated to fetch data stored in the memory cell to the sense amplifier, and a sense amplifier is then selected to output the sensed result.

Moreover, the sense amplifier of the synchronous mask ROM, which detects current flowing in the memory cell, identifies data stored in the memory cell and finally converts the current into voltage, is inherently a current detecting type sense amplifier. Conversely DRAM, in which data is stored by the presence or absence of electric charge on a capacitor comprising the memory cell, identifies stored data from the micro electric potential generated on the digit line by reading the electric charge, and has a voltage detecting type sense amplifier.

What is claimed is:

1. A semiconductor memory device, comprising:
    a latency length setting circuit for variably setting latency length, said latency length being a period from the time that an instruction to read data stored in a memory cell is performed to when said data is read out from said memory cell and output outside; and
    a control circuit for controlling such that a read operating period from when said instruction to read data is performed to when reading of said data is completed is proportional to said latency length;
    a sense amplifier for reading data stored in said memory cell, wherein said control circuit synchronizes said read operating period to a sense amplifier activation period where said sense amplifier is activated, wherein said sense amplifier includes:
        a differential amplifier that operates during said sense amplifier activation period to output data stored in said memory cell,
        an equalizer for short-circuiting differential output terminals of said differential amplifier during said sense amplifier activation period,
        bias circuits for supplying bias voltages to differential input terminals of said differential amplifier during said sense amplifier activation period,
        a reference cell for supplying a mean voltage of a first voltage applied to one differential input terminal when said memory cell is an on cell, and a second voltage applied to said one differential input terminal when said memory cell is an off cell, to an other differential input terminal, and
        current detectors for detecting currents flowing in said reference cell and an object memory cell to be read respectively.

2. A semiconductor device according to claim 1, wherein said sense amplifier increases with time, a difference between the first voltage applied to one differential input terminal corresponding to the current flowing in said memory cell, and the second voltage applied to the other differential input terminal corresponding to the current flowing in said reference cell, during said amplifier activation period.

3. A semiconductor memory device, comprising:
    a latency length setting circuit for variably setting latency length, said latency length being a period from the time that an instruction to read data stored in a memory cell is performed to when said data is read out from said memory cell and output outside;
    a control circuit for controlling such that a read operating period from when said instruction to read data is performed to when reading of said data is completed is proportional to said latency length;
    a sense amplifier for reading data stored in said memory cell; and
    an output buffer coupled to said sense amplifier that latches an output of said sense amplifier in response to a clock signal of said device, wherein said control circuit sets said read operating period to that obtained by subtracting an output period from said latency length, said output period being a period from when said reading is completed to when the data stored in said memory cell is output outside.

4. A semiconductor memory device according to claim 1, wherein said control circuit synchronizes said read operating period to a clock signal used to determine said latency length.

5. A semiconductor memory device according to claim 1, wherein said control circuit sets said read operating period based on data of said latency length being applied externally to address signal lines for assigning an object memory cell to be read.

6. A semiconductor memory device according to claim 1, wherein said control circuit generates a master signal, which is active for one cycle of a clock signal, to be used to determine said latency length, delays said master signal successively in synchronization with said clock signal to generate reference signals selected corresponding to said latency length, and combines these reference signals to set said sense amplifier activation period.

7. A semiconductor memory device according to claim 1, wherein said control circuit sets said read operating period to that obtained by subtracting an output period from said latency length, said output period being a period from when said reading is completed to when the data stored in said memory cell is output outside.

8. A semiconductor memory device comprising:
    a latency length setting circuit for variably setting latency length, being a period from the time that an instruction to read data stored in a memory cell is performed to when said data is read out from said memory cell and output outside;
    a control circuit for controlling such that a read operating period from when said instruction to read data is performed to when reading of said data is completed is proportional to said latency length; and
    a sense amplifier for reading data stored in said memory cell, wherein said control circuit synchronizes said read operating period to a sense amplifier activation period where said sense amplifier is activated,
    wherein said sense amplifier is provided with:
        a differential amplifier that operates during said sense amplifier activation period to output data stored in said memory cell,
        an equalizer for short-circuiting differential output terminals of said differential amplifier during said sense amplifier activation period,
        bias circuits for supplying bias voltages to the differential input terminals of said differential amplifier during said sense amplifier activation period,
        a reference cell for supplying a mean voltage of the voltage applied to one differential input terminal when said memory cell is an on cell, and the voltage applied to said one differential input terminal when said memory cell is an off cell, to an other differential input terminal, and current detectors for detecting currents flowing in said reference cell and an object memory cell to be read respectively.

9. A semiconductor device according to claim 8, further comprising:

a mode register that provides a latency signal to said control circuit, wherein said sense amplifier activation period varies according to said latency signal.

10. A semiconductor memory device according to claim 8, wherein said control circuit synchronizes said read operating period to a clock signal used to determine said latency length.

11. A semiconductor memory device according to claim 8, wherein said control circuit sets said read operating period based on data of said latency length being applied externally to address signal lines for assigning an object memory cell to be read.

12. A semiconductor memory device according to claim 8, wherein said control circuit generates a master signal, which is active for one cycle of a clock signal, to be used to determine said latency length, delays said master signal successively in synchronization with said clock signal to generate reference signals selected corresponding to said latency length, and combines these reference signals to set said sense amplifier activation period.

13. A semiconductor memory device according to claim 8, wherein said sense amplifier is a current detecting type sense amplifier for reading data stored in said memory cell corresponding to an amount of current flowing in said memory cell.

14. A semiconductor memory device according to claim 8, wherein said sense amplifier increases with time, a difference between a first voltage applied to one differential input terminal corresponding to the current flowing in said memory cell, and a second voltage applied to an other differential input terminal corresponding to the current flowing in said reference cell, during said sense amplifier activation period.

15. A semiconductor memory device according to claim 8, wherein said control circuit sets said read operating period to that obtained by subtracting the output period, being the period from when said reading is completed to when the data stored in said memory cell is output outside, from said latency length.

* * * * *